United States Patent
Lee et al.

(10) Patent No.: US 7,592,629 B2
(45) Date of Patent: Sep. 22, 2009

(54) GALLIUM NITRIDE THIN FILM ON SAPPHIRE SUBSTRATE HAVING REDUCED BENDING DEFORMATION

(75) Inventors: Chang Ho Lee, Seoul (KR); Sun Hwan Kong, Hwaseong-si (KR)

(73) Assignee: Samsung Corning Co., Ltd., Gyeonggi-Do (KR)

( * ) Notice: Subject to any disclaimer, the term of this patent is extended or adjusted under 35 U.S.C. 154(b) by 31 days.

(21) Appl. No.: 11/544,006

(22) Filed: Oct. 6, 2006

(65) Prior Publication Data

US 2007/0085163 A1    Apr. 19, 2007

(30) Foreign Application Priority Data

Oct. 7, 2005    (KR) .................. 10-2005-0094184

(51) Int. Cl.
*H01L 31/12* (2006.01)
*H01L 31/256* (2006.01)

(52) U.S. Cl. ............... 257/78; 257/631; 257/E33.001; 257/E33.034

(58) Field of Classification Search .......... 257/81, 257/E21.121, 78, 631, E33.001, E33.034
See application file for complete search history.

(56) References Cited

U.S. PATENT DOCUMENTS

| 6,528,394 | B1 | 3/2003 | Lee | |
| 6,829,270 | B2 * | 12/2004 | Suzuki et al. | 372/43.01 |
| 7,315,045 | B2 * | 1/2008 | Lee et al. | 257/79 |
| 2001/0049201 | A1 * | 12/2001 | Park | 438/758 |
| 2005/0167683 | A1 * | 8/2005 | Lee et al. | 257/81 |

FOREIGN PATENT DOCUMENTS

| EP | 0 966 047 A2 | 12/1999 |
| KR | 10-2005-0077915 | 8/2005 |

OTHER PUBLICATIONS

European Search Report issued in corresponding European Patent Application No. EP 06 12 1899 dated Feb. 28, 2007.

* cited by examiner

*Primary Examiner*—Lynne Gurley
*Assistant Examiner*—Vernon P Webb
(74) *Attorney, Agent, or Firm*—McDermott Will & Emery LLP

(57) ABSTRACT

A gallium nitride thin film on sapphire substrate having reduced bending deformation and a method for manufacturing the same. An etching trench structure is formed on a sapphire substrate by primary nitradation and HCl treatment and a gallium nitride film is grown thereon by secondary nitradation. The gallium nitride thin film on sapphire substrate comprises an etching trench structure formed on a sapphire substrate, wherein a function graph of a curvature radius Y according to a thickness X of a gallium nitride film satisfies Equation 1 below, and corresponds to or is located above a function graph drawn when $Y_0$ is 6.23±1.15, A is 70.04 ±1.92, and T is 1.59±0.12:

$$Y = Y_0 + A \cdot e^{-(X-1)/T}, \qquad \text{[Equation 1]}$$

where Y is the curvature radius m, X is the thickness of the gallium nitride film, and $Y_0$, A, and T are positive numbers.

4 Claims, 4 Drawing Sheets

GALLIUM NITRIDE THIN FILM ON SAPPHIRE SUBSTRATE HAVING REDUCED BENDING DEFORMATION

CROSS-REFERENCE TO RELATED APPLICATION

This application claims the benefit of Korean Patent Application No. 10-2005-0094184, filed on Oct. 7, 2005, in the Korean Intellectual Property Office, the disclosure of which is incorporated herein by reference.

BACKGROUND OF THE INVENTION

1. Field of the Invention

The present invention relates to a gallium nitride thin film on sapphire substrate having reduced bending deformation.

2. Description of the Related Art

Generally, a gallium nitride thin film is formed such that a gallium nitride film is grown on a sapphire substrate at a relatively low temperature and the growth is finally completed at a relatively high temperature. However, a bending occurs in the sapphire substrate due to a difference (about 16%) in lattice constants and a difference (about 35%) in thermal expansion coefficients between sapphire and gallium nitride.

FIG. 1 is a graph illustrating a bending range depending on a thickness of a gallium nitride thin film on sapphire substrate according to the related art. Referring to FIG. 1, it can be seen that a curvature radius is reduced as a bending range increases due to an increase of film thickness. Such bending causes the difference in crystalline characteristics between a center portion of a substrate and a periphery of the substrate, wherein a gallium nitride thin film is grown on the substrate. In the case where a light emitting diode is manufactured by using such a substrate, a problem occurs in that a light emitting wavelength becomes uneven in the substrate. Recently, a gallium nitride film, which is used as a lower substrate for a light emitting diode and an electronic device, requires an increase in thickness to reduce defect density and increase crystalline characteristics. However, in this case, problems occur in that uniformity in device quality of a substrate is reduced due to an increase of bending deformation, thus, yield of the product is rapidly reduced.

Accordingly, in order to improve crystalline characteristics and reduce defect density through an increase of film thickness, and to improve characteristics of a light emitting device and an electronic device by increasing electrical reliability, a gallium nitride thin film on sapphire substrate is required, wherein a bending is maintained and does not increase even though the thickness of the gallium nitride film increases.

In this respect, the U.S. Pat. No. 6,528,394 discloses a method of growing an aluminum nitride layer of a concave-convex shaped structure between a gallium nitride layer and a sapphire substrate to reduce surface stress between the gallium nitride layer and the sapphire substrate, wherein the surface stress causes bending deformation. The Korean Patent Application No. 2004-5585 discloses a gallium nitride thin film on sapphire substrate having reduced bending deformation through control in size and distribution density of an aluminum nitride having a concave-convex shaped structure.

SUMMARY OF THE INVENTION

To solve the above described and/or other problems, the present invention provides a gallium nitride thin film on sapphire substrate and a method for manufacturing the same, in which bending deformation is remarkably reduced to improve characteristics and uniformity of a light emitting diode and an electronic device which are final products.

Additional aspects and/or advantages of the invention will be set forth in part in the description which follows and, in part, will be apparent from the description, or may be learned by practice of the invention.

According to an aspect of the present invention, a gallium nitride thin film on sapphire substrate comprises an etching trench structure formed on a sapphire substrate, wherein a function graph of a curvature radius Y according to a thickness X of a gallium nitride film satisfies Equation 1 below, and corresponds to or is located above a function graph drawn when $Y_0$ is 6.23±1.15, A is 70.04±1.92, and T is 1.59±0.12:

$$Y = Y_0 + A \cdot e^{-(X-1)/T},\qquad \text{[Equation 1]}$$

where Y is the curvature radius m, X is the thickness of the gallium nitride film, and $Y_0$, A and T are positive numbers.

According to another aspect of the present invention, a method for manufacturing a gallium nitride thin film on sapphire substrate, which comprises (a) forming an aluminum nitride crystal by primarily nitridating a sapphire substrate, (b) forming an etching trench structure having the same shape as that of the aluminum nitride crystal by etching the substrate using HCl gas, (c) forming an aluminum nitride concave-convex structure by secondarily nitradating the etched sapphire substrate, and (d) growing a gallium nitride film on the nitradated sapphire substrate.

BRIEF DESCRIPTION OF THE DRAWINGS

The above and/or other aspects and advantages of the present invention will become apparent and more readily appreciated from the following detailed description, taken in conjunction with the accompanying drawings of which.

DETAILED DESCRIPTION OF THE PREFERRED EMBODIMENTS

Figure 1:
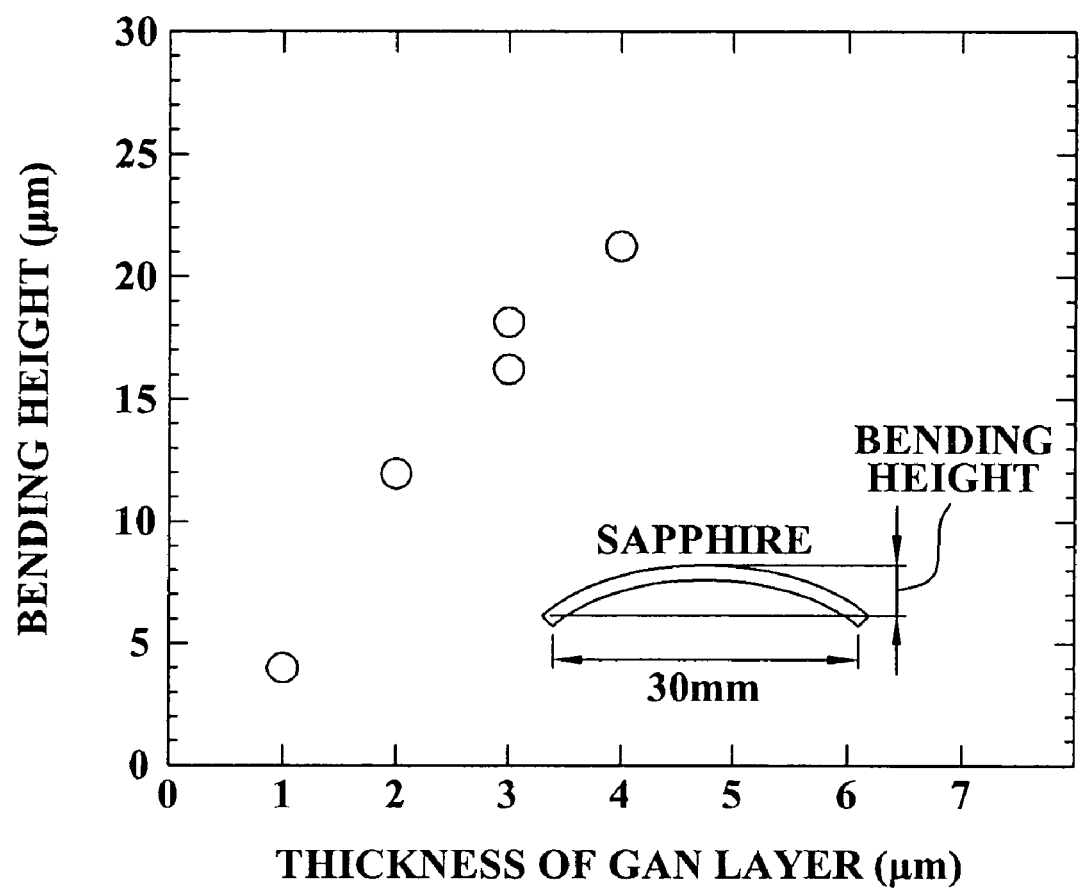
FIG. 1 is a graph illustrating a bending range depending on a thickness of a gallium nitride film in a gallium nitride thin film on sapphire substrate according to the related art.

Reference will now be made in detail to embodiments of the present invention, examples of which are illustrated in the accompanying drawings, wherein like reference numerals refer to the like elements throughout. The embodiments are described below in order to explain the present invention by referring to the figures.

In the present invention, in order to manufacture a gallium nitride thin film on sapphire substrate, after an etching trench structure is formed by primary nitridation and hydrogen chloride treatment of a sapphire substrate, a gallium nitride is grown on the sapphire substrate by secondary nitradation to obtain a gallium nitride thin film on sapphire substrate having reduced bending characteristics of a curvature radius or greater expressed by Equation 1.

Figure 2:
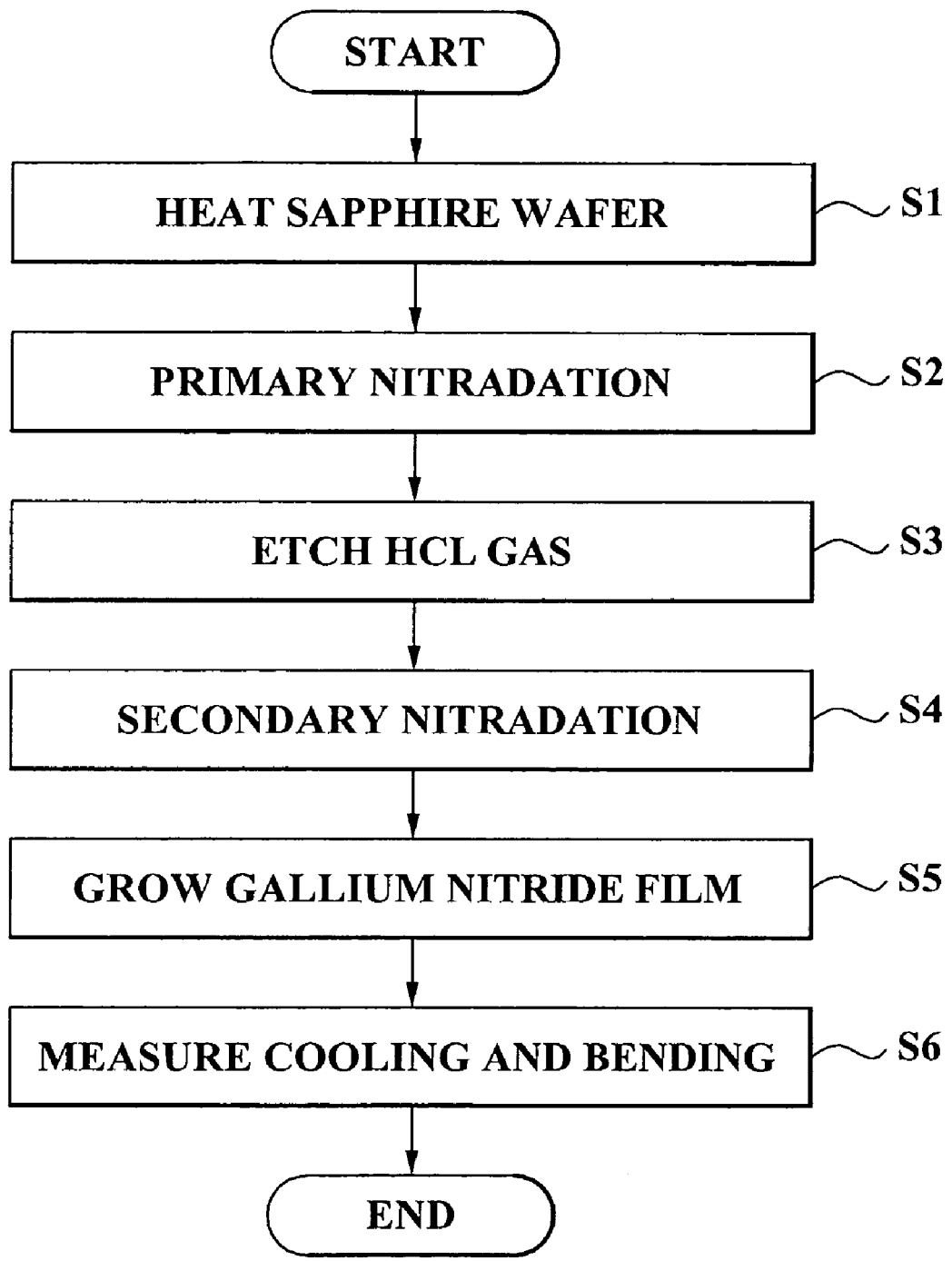
FIG. 2 is a flowchart illustrating process operations of manufacturing a gallium nitride thin film on sapphire substrate according to the present invention.

FIG. 2 is a flowchart illustrating process operations of manufacturing a gallium nitride thin film on sapphire substrate according to the present invention.

First, a sapphire substrate is heated (S1), and an ammonia gas is flowed onto the heated sapphire substrate at a high temperature of more than 900° C. to nitridate the substrate (first nitridation) (S2). Aluminum corresponding to III-group atom is reacted with a nitrogen atom of the ammonia gas by such nitridation to form III-group nitride crystal of aluminum nitride.

Figure 3A:
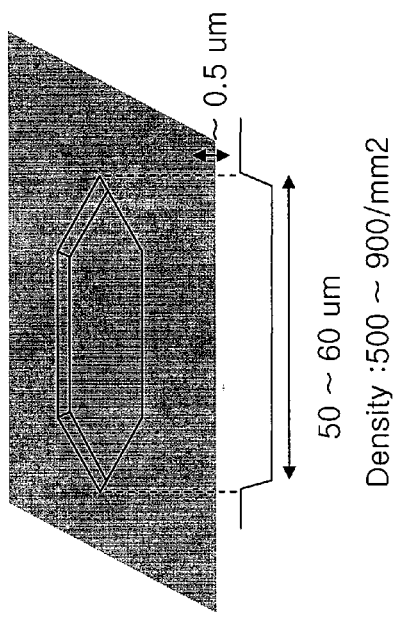
FIGS. 3A and 3B illustrate a result taken by a three-dimensional interference microscope and a result taken by a two-dimensional microscope with respect to a hexagonal etching trench formed on a sapphire substrate in accordance with the present invention.
Figure 3C:
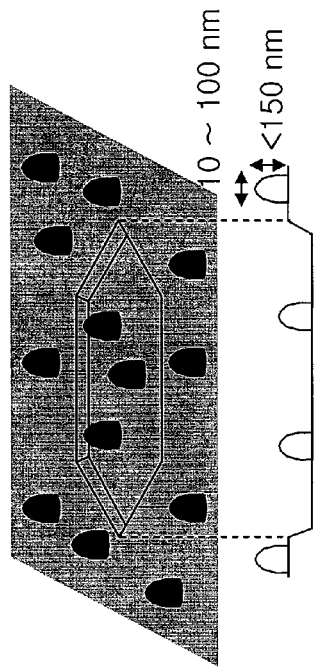
FIG. 3C illustrates a hexagonal etching trench and nitride concave-convex structures on a sapphire substrate.
Figure 3B:
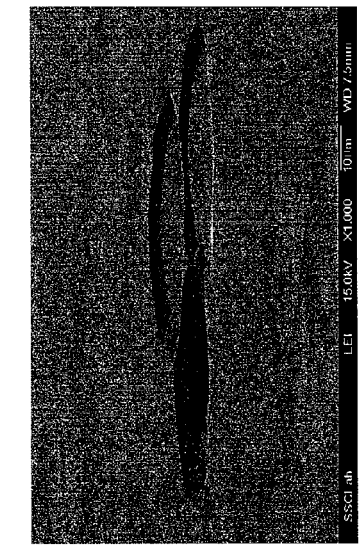

A hydrogen chloride (HCl) gas is supplied to the sapphire substrate at a temperature of more than 900° C. (S3). The aluminum nitride crystal and a surface of the sapphire substrate therebelow are etched by the hydrogen chloride gas to form a hexagonal trench structure. FIG. 3A illustrates a result taken by a three-dimensional interference microscope and FIG. 3B illustrates a result taken by a two-dimensional microscope with respect to the etching trench structure formed in accordance with the present invention. The etching trench structure formed by the process of the hydrogen chloride gas according to the present invention has a height of less than 0.5 µm and a width in the range of 50 µm to 60 µm. Preferably, the number of the etching trench structures is in the range of 500 to 900 per 1 mm². A relative area of the surface of the sapphire substrate increases due to such a trench structure.

Next, a mixture gas of ammonia and hydrogen chloride is supplied to the sapphire substrate where the hexagonal etching trench structure is formed, at a temperature of more than 900° C. to perform secondary nitradation (S4). The secondary nitradation is based on the method disclosed in U.S. Pat. No. 6,528,394. The frequency of an aluminum nitride concave-convex structure formed on the sapphire substrate remarkably increases as a relative surface area of the sapphire substrate increases due to the trench structure previously formed, whereby surface stress generated between sapphire and gallium nitride is remarkably reduced. According to the present invention, the aluminum nitride concave-convex structure has a height less than 150 nm and a width in the range of 10 nm to 100 nm, and the number of concave-convex structures is in the range of 25 to 500 per 1 µm².

After a gallium nitride thin film is formed on the secondarily nitradated sapphire substrate (S5) and then cooled (S6), a gallium nitride thin film on sapphire substrate is obtained. The gallium nitride thin film is grown by a metal organic chemical vapor deposition (MOCVD) method or a hydride vapor phase epitaxy (HVPE) method at a temperature more than 900° C., preferably in the range of 950° C. to 1050° C. At this time, the gallium nitride thin film has a growth thickness of several µm or greater. Preferably, the gallium nitride thin film has a growth thickness in the range of 0.5 µm to 20 µm, and more preferably, less than 10 µm so as to satisfy a curvature radius according to the present invention.

The cooling operation is performed at a room temperature, and a bending which is convex upwardly occurs in the laminate during the cooling operation. The bending is caused by a difference (about 35%) in thermal expansion coefficients between the sapphire substrate and the gallium nitride film, wherein sapphire having a relatively greater thermal expansion coefficient is more contracted.

The gallium nitride thin film on sapphire substrate of the present invention manufactured as above has a greater range than a curvature radius value defined by Equation 1 when the curvature radius is measured.

Furthermore, when the gallium nitride thin film on sapphire substrate having a small bending range is manufactured as above, a growth time period of single crystalline gallium nitride is increased to form a single crystalline gallium nitride film having a thickness of 100 µm. In this case, the single crystalline gallium nitride film is separated from the sapphire substrate by a conventional separation method to obtain a freestanding single crystalline gallium nitride film. The gallium nitride substrate obtained as above can be used as a seed substrate for re-growth of single crystalline GaN due to having a bending range less than that of the existing substrate.

Hereinafter, the present invention will be described in more detail through an example. It is to be understood that the following example is exemplary and explanatory to assist understanding of the present invention but is not intended to limit the scope of the invention as claimed.

EXAMPLE 1

An ammonia gas of 2000 sccm to 4000 sccm was injected into a sapphire substrate 11 having a diameter of 2 inches and a thickness of 430 µm for one minute to one and a half minutes to form an aluminum nitride crystal having a concave-convex structure. Subsequently, a hydrogen chloride gas of 500 sccm to 1000 sccm was injected onto the sapphire substrate 11 for two minutes to three minutes to etch the aluminum nitride concave-convex structure and the sapphire surface below the concave-convex structure, whereby a hexagonal trench structure was formed.

Next, after ammonia and hydrogen chloride are injected onto the etched sapphire substrate at a flow rate of 12:1 to nitridate the sapphire substrate, a gallium nitride film was grown on the sapphire substrate by the HVPE method at a temperature in a range of 950° C. to 1050° C. At this time, the ammonia gas was supplied as a nitrogen component (V-group) required for growth of gallium nitride, and the gallium chloride gas obtained by reaction between gallium and a hydrogen chloride gas was supplied as a gallium component (III-group), wherein a ratio of the V-group/III-group gases was in a range of 5 to 10.

Figure 4:
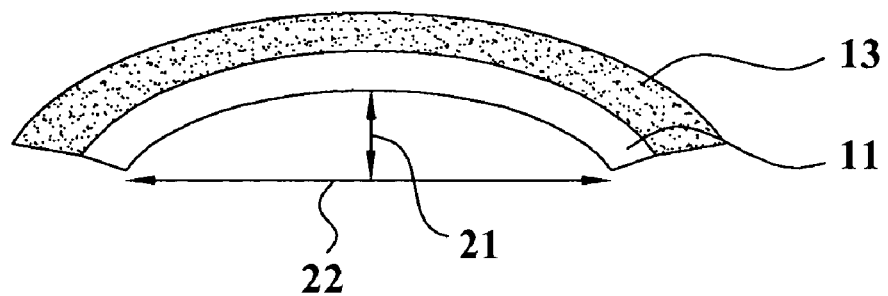
FIG. 4 illustrates a method of measuring a curvature radius of a sapphire substrate on which a gallium nitride thin film is grown.

The curvature radius according to the thickness of the gallium nitride thin film with respect to the gallium nitride thin film on sapphire substrate was measured as shown in FIG. 4. Specifically, after the sapphire substrate 11, on which the gallium nitride film 13 was grown, was arranged on a flat plate to upwardly put a convex surface, the thickness corresponding to the center portion of the substrate was measured and then the substrate was turned upside down to again measure its center portion, whereby the height difference 21 (ΔH) was measured and the curvature radius R corresponding to a fixed range of the substrate bending was calculated by the equation $R = D^2/8\Delta H$ using the measured height difference 21 (ΔH) and the diameter 22 (D=50 mm), as expressed in Table 1 below.

TABLE 1

| Film thickness (µm) of gallium nitride | Curvature radius (R) (m) | Substrate |
|---|---|---|
| 1.4 | 76.5 | Sapphire (0001) |
| 2.9 | 30.4 | Thickness = 430 µm |
| 5.7 | 12.5 | |

TABLE 1-continued

| Film thickness (μm) of gallium nitride | Curvature radius (R) (m) | Substrate |
|---|---|---|
| 8.1 | 7.5 | |
| 15.9 | 5.2 | |

Comparable Example 1

In this comparable example 1, a gallium nitride film was grown directly on a sapphire substrate by using a conventional MOCVD method to obtain a gallium nitride thin film on sapphire substrate (same as shown in FIG. 1). Afterwards, a curvature radius R according to the thickness of the gallium nitride film was measured as shown in Table 2 below, in the same manner as the aforementioned example 1 of the present invention.

TABLE 2

| Film thickness (μm) of gallium nitride | Curvature radius (R) (m) | Substrate |
|---|---|---|
| 1 | 29.6 | Sapphire (0001) |
| 2 | 9.4 | Thickness = 430 μm |
| 3 | 6.5 | |
| 4 | 5.4 | |

Comparable Example 2

In this comparable example 2, an aluminum nitride concave-convex structure was formed on a sapphire substrate 11 in accordance with the method disclosed in Korean Patent Application No. 2004-5585, with a flow rate of HCl and ammonia in a range of 1:12 during nitradation, and then a gallium nitride film was grown on the sapphire substrate to obtain a gallium nitride thin film on sapphire substrate. Afterwards, a curvature radius R according to the thickness of the gallium nitride film was measured as shown in Table 3 below, in the same manner as the aforementioned example 1 of the present invention.

TABLE 3

| Film thickness (μm) of gallium nitride | Curvature radius (R) (m) | Substrate |
|---|---|---|
| 1 | 78.1 | Sapphire (0001) |
| 1.5 | 52.1 | Thickness = 430 μm |
| 4 | 11.2 | |
| 8 | 5.3 | |

When comparing Tables 1 to 3, it can be seen that the gallium nitride thin film on sapphire substrate according to the example 1 of the present invention has a three times greater increase in curvature radius than the laminate of the comparable example 1 manufactured without a trench structure and aluminum nitride concave-convex structure, and also a 30% increase over the laminate of the comparable example 2 manufactured without a trench structure. Specifically, it is noted that bending deformation was remarkably reduced.

Figure 5:
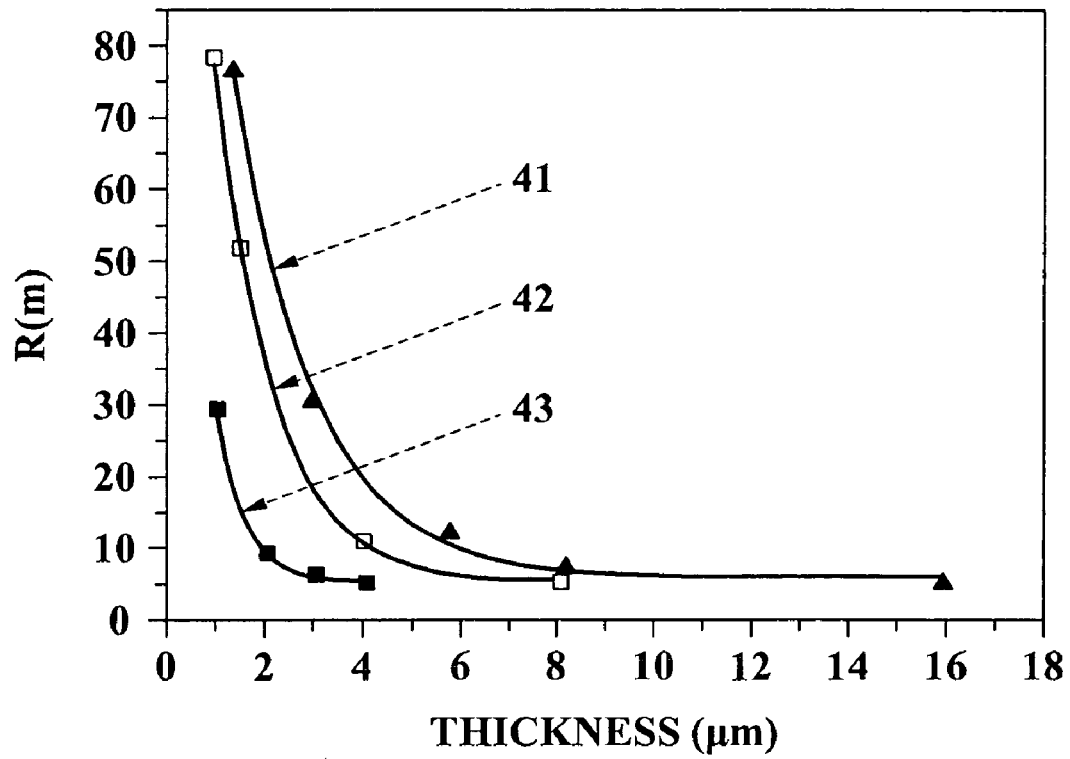
FIG. 5 is a comparison graph illustrating a curvature radius of a laminate substrate according to the present invention and a curvature radius of a laminate substrate according to the related art depending on thickness of a gallium nitride thin film.

The measurement results of the bending according to the example 1 and the comparable examples 1 and 2 are shown in FIG. 5. Referring to FIG. 5, a curve 41 represents the curvature radius of the laminate substrate according to the example 1 of the present invention, and curves 43 and 42 respectively represent curvature radiuses of the laminate substrate according to the comparable examples 1 and 2. Specifically, referring to the equation 1, the curve 41 represents the curvature radius of the gallium nitride thin film on sapphire substrate according to the present invention in a range that $Y_0$ is 6.23±1.15, A is 70.04±1.92, and T is 1.59±0.12, the curve 42 of the comparable example 2 represents the curvature radius in a range that $Y_0$ is 5.44±0.55, A is 72.52±0.74, and T is 1.15±0.04, and the curve 43 of the comparable example 1 represents the curvature radius in a range that $Y_0$ is 5.47±0.34, A is 24.13±0.50, and T is 0.56±0.04. In this case, it is noted that the curvature radius of the comparable example 1 is smaller than that of the present invention.

According to the present invention, after the trench structure is formed on the sapphire substrate and nitradation is performed, single crystal is grown thereon, whereby the bending deformation is remarkably reduced to obtain the gallium nitride thin film on sapphire substrate of which a curvature radius satisfies the specific equation. As the bending of the laminate is reduced, it is possible to improve characteristics and uniformity of the light emitting diode and the electronic device which are final products.

Although a few embodiments of the present invention have been shown and described, the present invention is not limited to the described embodiments. Instead, it would be appreciated by those skilled in the art that changes may be made to these embodiments without departing from the principles and spirit of the invention, the scope of which is defined by the claims and their equivalents.

What is claimed is:

1. A gallium nitride thin film on sapphire substrate comprising:
    an etching trench structure formed on a sapphire substrate,
    wherein a function graph of a curvature radius Y according to a thickness X of a gallium nitride film satisfies the following Equation 1 and corresponds to or is located above a function graph drawn when $Y_0$ is 6.23±1.15, A is 70.04±1.92, and T is 1.59±0.12:

$$Y = Y_0 + A \cdot e^{-(X-1)/T}$$ [Equation 1]

where Y is the curvature radius m, X is the thickness of the gallium nitride film, and Y.sub.0, A, and T are positive numbers.

2. The gallium nitride thin film on sapphire substrate of claim 1, wherein the etching trench structure has a height less than 0.5 μm, a width in the range of 50 μm to 60 μm, and the frequency in the range of 500 to 900 per 1mm².

3. An electric or electronic device comprising a gallium nitride thin film on sapphire substrate according to claim 1 or 2.

4. A single crystalline gallium nitride film obtained by being separated from a gallium nitride thin film on sapphire substrate according to claim 1 or 2.

* * * * *